(12) United States Patent
Hwang et al.

(10) Patent No.: US 7,502,231 B2
(45) Date of Patent: *Mar. 10, 2009

(54) THIN PRINTED CIRCUIT BOARD FOR MANUFACTURING CHIP SCALE PACKAGE

(75) Inventors: Yi-Sung Hwang, Chungcheongnam-do (KR); Ho-Tae Jin, Chungcheongnam-do (KR); Hwan-Young Jang, Chungcheongnam-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/950,971

(22) Filed: Dec. 5, 2007

(65) Prior Publication Data
US 2008/0083561 A1 Apr. 10, 2008

Related U.S. Application Data

(62) Division of application No. 10/893,615, filed on Jul. 16, 2004, now Pat. No. 7,323,642.

(30) Foreign Application Priority Data
Jul. 16, 2003 (KR) .............................. 2003-48652

(51) Int. Cl.
*H05K 7/00* (2006.01)
(52) U.S. Cl. .................. 361/777; 361/749; 174/254
(58) Field of Classification Search ................ 361/730, 361/777, 749; 174/254; 257/668
See application file for complete search history.

(56) References Cited

U.S. PATENT DOCUMENTS

| 5,170,328 | A |   | 12/1992 | Kruppa |
| 5,661,086 | A | * | 8/1997  | Nakashima et al. ......... 257/668 |
| 5,715,143 | A | * | 2/1998  | McHugh et al. ............. 361/749 |
| 6,013,535 | A | * | 1/2000  | Moden et al. ................. 438/15 |
| 6,147,401 | A | * | 11/2000 | Solberg ...................... 257/723 |

(Continued)

FOREIGN PATENT DOCUMENTS

KR   1998-060522   11/1998

(Continued)

OTHER PUBLICATIONS

English language abstract of Korean Publication No. 1998-060522.

(Continued)

*Primary Examiner*—Dean A. Reichard
*Assistant Examiner*—Andargie M Aychillhum
(74) *Attorney, Agent, or Firm*—Marger Johnson & McCollom, P.C.

(57) ABSTRACT

Provided is a thin printed circuit board (PCB) for manufacturing a chip scale package (CSP). The thin printed circuit board includes a plurality of unit printed circuit boards, each of which is comprised of a circuit pattern, to which a semiconductor chip is adhered, and a substrate surrounding the circuit pattern. The unit printed boards are arranged in a row and includes a support molding, which is spaced a predetermined interval apart from the circuit pattern of each unit printed circuit board on the substrate of each unit printed circuit board and formed in a ring shape along the edge of the thin printed circuit board.

7 Claims, 3 Drawing Sheets

U.S. PATENT DOCUMENTS

| | | |
|---|---|---|
| 6,201,299 B1 | 3/2001 | Tao et al. |
| 6,246,015 B1 | 6/2001 | Kim |
| 6,300,577 B1 * | 10/2001 | Tsujii ......................... 174/261 |
| 6,469,258 B1 * | 10/2002 | Lee et al. .................... 174/261 |
| 6,473,311 B1 | 10/2002 | James et al. |
| 6,548,764 B1 * | 4/2003 | Prindiville et al. .......... 174/255 |
| 6,617,671 B1 * | 9/2003 | Akram ....................... 257/668 |
| 6,617,680 B2 | 9/2003 | Chien-Chih et al. |
| 6,700,077 B2 * | 3/2004 | Chiang ...................... 174/262 |
| 6,861,764 B2 | 3/2005 | Sato et al. |
| 6,914,196 B2 * | 7/2005 | Cho .......................... 174/254 |

FOREIGN PATENT DOCUMENTS

| | | |
|---|---|---|
| KR | 2002-0053414 | 7/2002 |

OTHER PUBLICATIONS

English language abstract of Korean Publication No. 2002-0053414.

* cited by examiner

THIN PRINTED CIRCUIT BOARD FOR MANUFACTURING CHIP SCALE PACKAGE

CROSS REFERENCE TO RELATED APPLICATIONS

This application is a Divisional of U.S. Ser. No. 10/893,615, filed on Jul. 16, 2004, now issued as U.S. Pat. No. 7,323,642, which claims priority from Korean Patent Application No. 2003-48652, filed on Jul. 16, 2003, all of which are hereby incorporated by reference in their entirety.

BACKGROUND OF THE INVENTION

1. Field of the Invention

The present invention relates to a printed circuit board (PCB) for manufacturing a semiconductor package, and more particularly, to a thin PCB for manufacturing a chip scale package (CSP).

2. Description of the Related Art

In recent years, as most electronic products including various portable data communication devices, such as personal computers, cellular phones, and personal data terminals, have been scaled down and become more light-weight and efficient, their data processing capacities have increased. Thus, using a chip scale package (CSP) technique, a semiconductor chip can be assembled in a semiconductor package having a size similar to or slightly larger than the chip size. CSP techniques vary according to manufacturing methods, for example, a thin PCB method of manufacturing a CSP. In this method, semiconductor packages comprise a semiconductor chip manufactured with a thin PCB. However, the thickness (e.g., 0.17 mm or less) of a conventional thin PCB for manufacturing a CSP is typically smaller than that (e.g., 3 mm) of a conventional PCB for manufacturing a typical semiconductor package.

FIGS. 1 through 3 are diagrams illustrating problems of a conventional thin PCB. As shown in FIG. 1, in a conventional thin PCB 10, a plurality of unit PCBs 10a, 10b, and 10c are connected in a row. Although only three exemplary unit PCBs 10a, 10b, and 10c are illustrated in FIG. 1, the thin PCB 10 can include a greater number of unit PCBs. Circuit patterns 11a, 11b, and 11c are disposed in the unit PCBs 10a, 10b, and 10c, respectively. A plurality of holes (not shown) are formed in each of the circuit patterns 11a, 11b, and 11c. A plurality of holes or slots 12 are vertically arranged at interfaces between adjacent unit PCBs, for example, between the unit PCBs 10a and 10b or 10b and 10c. These holes or slots 12 suppress distortion of the PCB 10. A plurality of holes 13 are formed in an upper portion of the thin PCB 10, and a plurality of holes 14 are formed in a lower portion thereof. These holes 13 and 14 are used as recognition marks for a package manufacturing apparatus and may be used for alignment of the thin PCB 10 when the thin PCB 10 is transferred.

As described above, the thin PCB 10 has a relatively small thickness. Thus, the thin PCB 10 is flexible and makes it difficult to manufacture semiconductor packages. Thus, one solution shown in FIG. 2 was proposed. That is, semiconductor packages are manufactured using a carrier 20 supporting a thin PCB 10. In this method, since the thin PCB 10 is supported by the carrier 20, it is inflexible during package manufacturing processes. The carrier 20 can be formed of an inflexible material, for example, a sus material. A vacant space 23 is located in the center of the carrier 20 so as to expose the rear surface of the thin PCB 10. The carrier 20 is a kind of frame that surrounds the vacant space 23. Holes 21 are formed on both lateral surfaces of the carrier 20, and a mark 22 is formed on an edge thereof. The holes 21 and the mark 22 are used as recognition marks and may be used for alignment of the carrier 20 when the carrier 20 is transferred.

As shown in FIG. 3, in order to adhere the thin PCB 10 to the carrier 20, the thin PCB 10 is first mounted on the carrier 20. Only the upper and lower portions of the thin PCB 10 overlap upper and lower portions of the carrier 20 and are supported by the carrier 20, and the remaining portion of the thin PCB 10 do not overlap the carrier 20. Next, the thin PCB 10 is secured to the carrier 20 by an adhesive 31. The adhesive 31 is applied to the upper and lower portions of the thin PCB 10 and the upper and lower portions of the carrier 20.

As described above, since the conventional thin PCB 10 has a very small thickness, it should be adhered to a supporting portion such as the carrier 10 and used in package manufacturing processes. Thus, prior to the package manufacturing processes, additional processes of aligning and adhering the thin PCB 10 to the carrier 20 should be performed. Also, after a semiconductor package is completed, a process of removing the adhesive 31 from the carrier 20 should be further performed to reuse the carrier 20.

SUMMARY OF THE INVENTION

The present invention provides a thin printed circuit board (PCB) that is inflexible during package manufacturing processes, despite its very small thickness.

According to an aspect of the present invention, there is provided a thin printed circuit board for manufacturing a chip scale package. The thin printed circuit board comprises a plurality of unit printed circuit boards which each adhere to a semiconductor chip, and a substrate surrounding the circuit pattern. Each unit printed circuit board comprises a circuit pattern. The unit printed boards are arranged in a row. The thin printed circuit board comprises a support molding, which is spaced a predetermined interval apart from the circuit pattern of each unit printed circuit board on the substrate of each unit printed circuit board and formed in a ring shape along the edge of the thin printed circuit board.

The support molding may comprise epoxy molding compound or resin.

The support molding can be formed using a metal pattern.

One or more holes or slots can be vertically arranged at interfaces between adjacent unit printed circuit boards to prevent distortion of the thin printed circuit board.

According to another aspect of the present invention, there is provided a thin printed circuit board for manufacturing a chip scale package. The thin printed circuit board comprises a plurality of unit printed circuit boards, each of which comprises a circuit pattern, to which a semiconductor chip is adhered, and a substrate surrounding the circuit pattern. The unit printed boards may be arranged in a row. The thin printed circuit board comprises one or more slots, which are vertically arranged at interfaces between the unit printed circuit boards; and support moldings, which are spaced apart from the circuit patterns of the unit printed circuit boards above and below the interfaces between the unit printed circuit boards and formed perpendicular to the direction in which the slots are formed.

The support moldings can be formed of one of an epoxy molding compound and a resin.

The support moldings can be formed using a metal pattern.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which preferred embodiments of the invention are shown. This invention may, however, be embodied in many different forms and should not be construed as being limited to the embodiments set forth herein.

Figure 1:
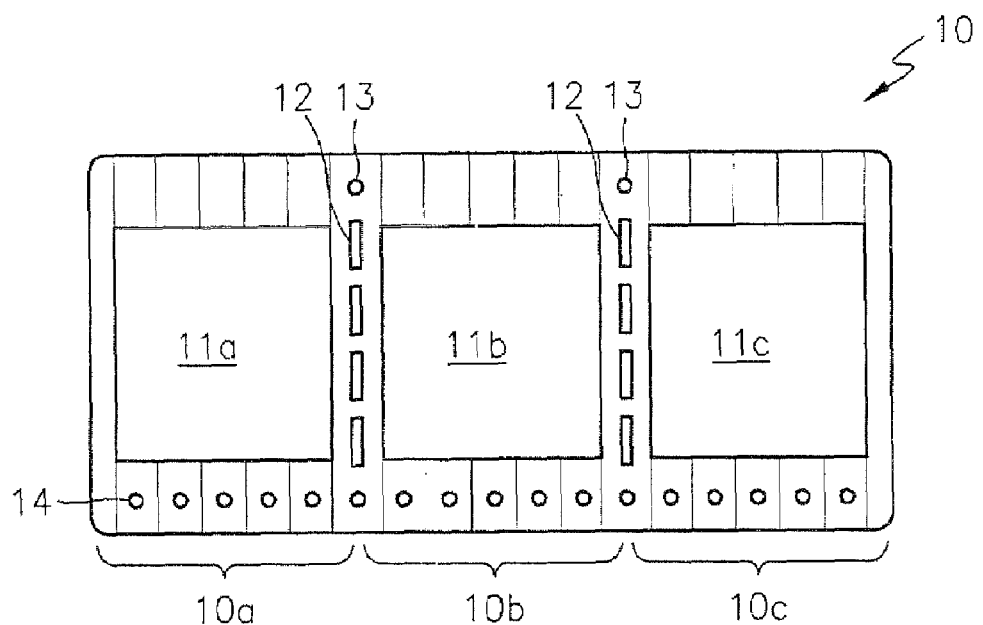
FIGS. 1 through 3 are diagrams illustrating a conventional thin PCB.
Figure 2:
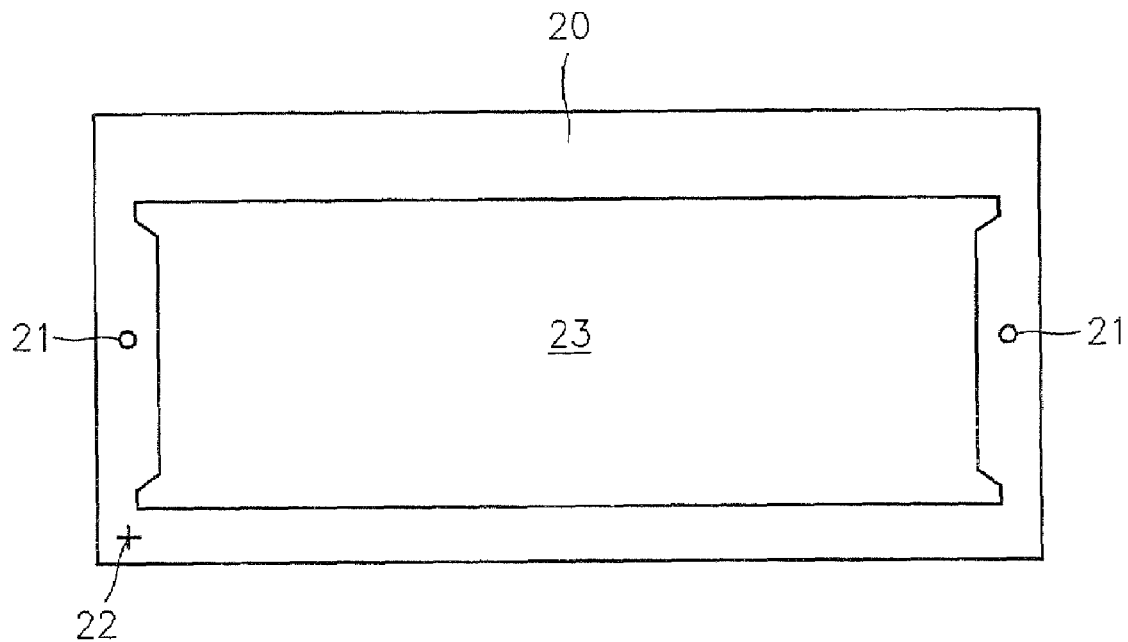
Figure 3:
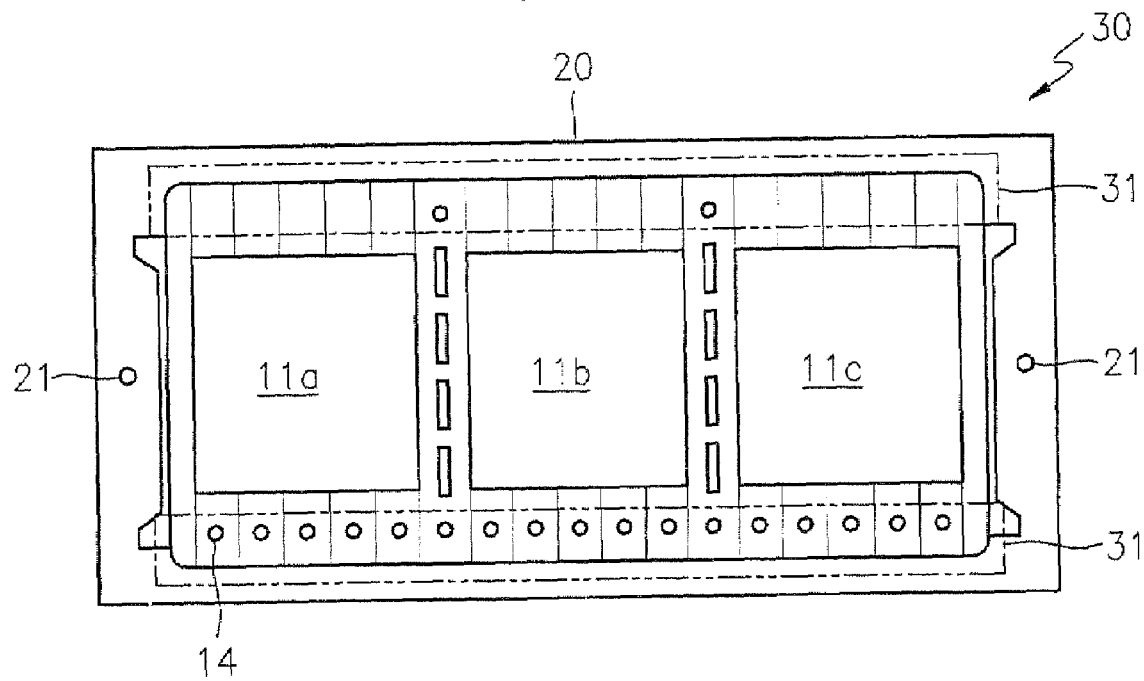
Figure 4:
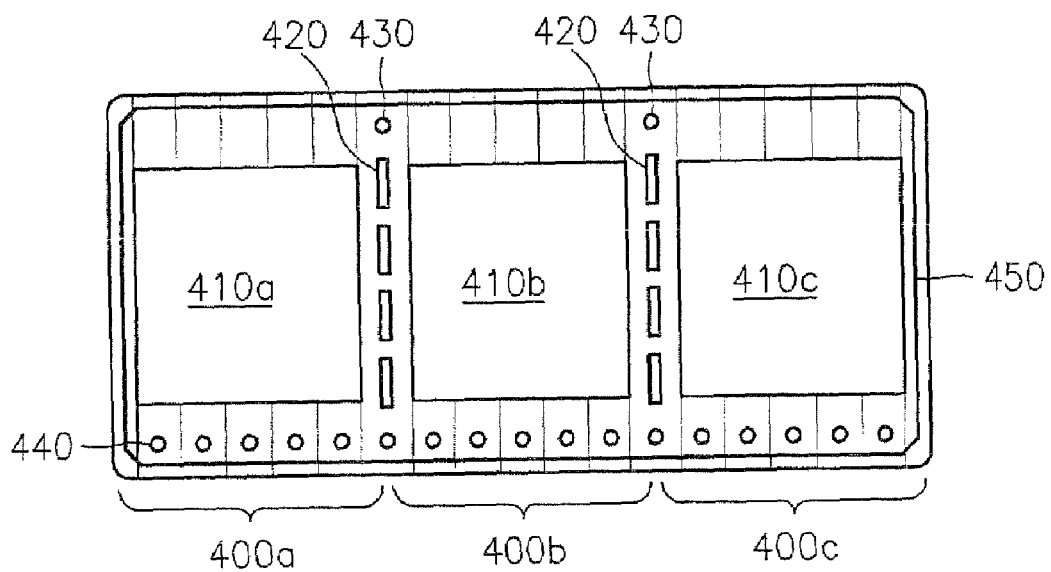
FIG. 4 is a diagram illustrating a thin PCB according to an embodiment of the present invention.

FIG. 4 is a diagram illustrating a thin PCB according to an embodiment of the present invention.

Referring to FIG. 4, a thin PCB 400 of the present embodiment comprises a plurality of unit PCBs 400a, 400b, and 400c, which are connected in a row. Although only three exemplary unit PCBs 400a, 400b, and 400c are illustrated in FIG. 4, the thin PCB 400 can include a greater number of unit PCBs. Circuit patterns 410a, 410b, and 410c are formed in the unit PCBs 400a, 400b, and 400c, respectively. A plurality of holes (not shown) are formed in each of the circuit patterns 410a, 410b, and 410c. A semiconductor chip is adhered to each of the circuit patterns 410a, 410b, and 410c in a subsequent process, and a signal is transmitted from the semiconductor chip through the holes formed in the circuit pattern 410a, 410b, or 410c out of the package. A plurality of holes or slots 420 are vertically arranged at interfaces between adjacent unit PCBs, for example, between the unit PCBs 410a and 410b or 410b and 410c. These holes or slots 420 suppress distortion of the thin PCB 400. A plurality of holes 430 are formed in an upper portion of the thin PCB 400, and a plurality of holes 440 are formed in a lower portion thereof. These holes 430 and 440 are used as recognition marks for a package manufacturing apparatus and may be used for alignment of the thin PCB 400 during thin PCB 400 transfer.

A support molding 450 is formed along the edge of the thin PCB 400. In the present embodiment the support molding 450 is formed of an epoxy molding compound (EMC) or a resin and formed using a metal pattern. The support molding 450 may be formed in a ring shape along the edge of the thin PCB 400 and spaced apart from the circuit patterns 410a, 410b, and 410c. That is, the support molding 450 may not contact the circuit patterns 410a, 410b, and 410c. The support molding 450 can support the circumference of the thin PCB 400. Thus, the thin PCB 400 can be inflexible during package manufacturing processes despite its very small thickness.

Figure 5:
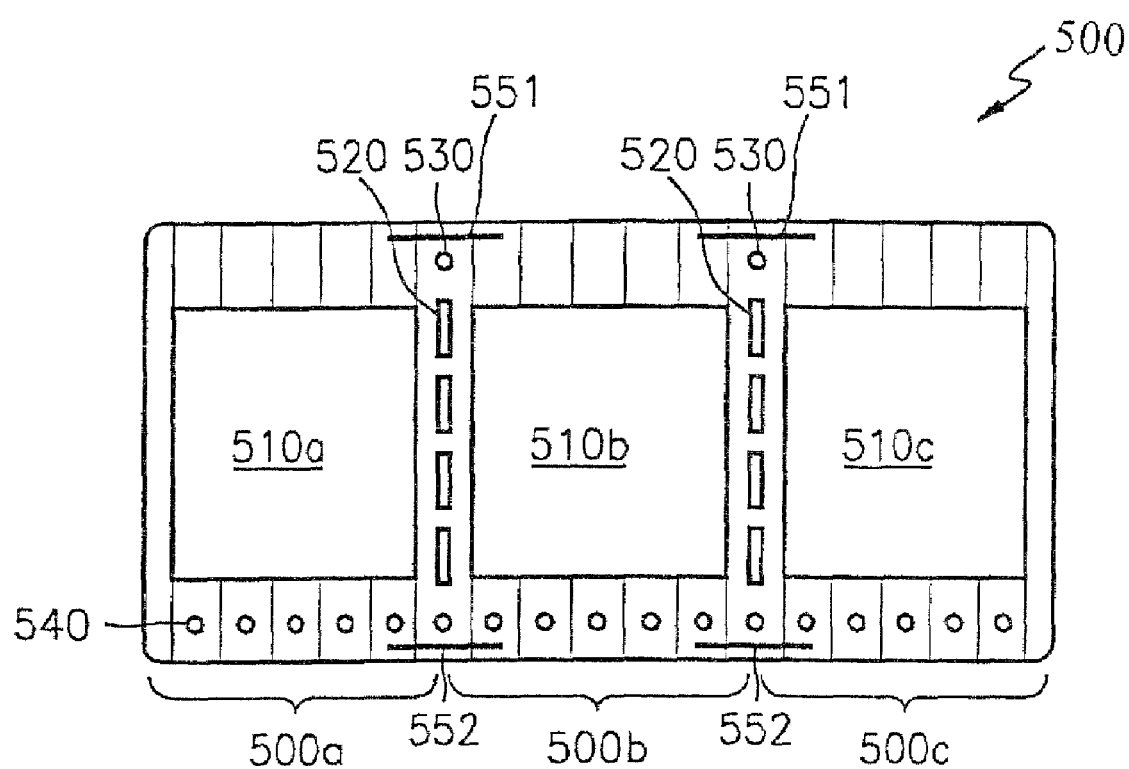
FIG. 5 is a diagram illustrating a thin PCB according to another embodiment of the present invention.

FIG. 5 is a diagram illustrating a thin PCB according to another embodiment of the present invention.

Referring to FIG. 5, the thin PCB 500 of the present embodiment comprises a plurality of unit PCBs 500a, 500b, and 500c, which are connected in a row. Although only three exemplary unit PCBs 500a, 500b, and 500c are illustrated in FIG. 5, the thin PCB 500 can include a greater number of unit PCBs. Circuit patterns 510a, 510b, and 510c are formed in the unit PCBs 500a, 500b, and 500c, respectively. A plurality of holes (not shown) are formed in each of the circuit patterns 510a, 510b, and 510c. A semiconductor chip is adhered to each of the circuit patterns 510a, 510b, and 510c in a subsequent process, and a signal is transmitted from the semiconductor chip through the holes formed in the circuit pattern 510a, 510b, or 510c out of the package. A plurality of holes or slots 520 are vertically arranged at interfaces between adjacent unit PCBs, for example, between the unit PCBs 510a and 510b or 510b and 510c. These holes or slots 520 suppress distortion of the thin PCB 500. A plurality of holes 530 are formed in an upper portion of the thin PCB 500, and a plurality of holes 540 are formed in a lower portion thereof. These holes 530 and 540 are used as recognition marks for a package manufacturing apparatus and may be used for alignment of the thin PCB 500 during thin PCB 500 transfer.

In the thin PCB 500, portions where the slots 520 are formed are most vulnerable to external force and flexible. Thus, support moldings 551 and 552 may be formed above and below the interface between adjacent unit PCBs 500a, 500b, and 500c, that is, above and below the portions where the slots 520 are formed. Although the slots 520 are formed vertically, the support moldings 551 and 552 may be formed horizontally, i.e., substantially perpendicular to the direction in which the slots 520 are arranged. As in the first embodiment, the support moldings 551 and 552 may not contact any of the circuit patterns 510a, 510b, and 510c. In the present embodiment the support moldings 551 and 552 are formed of an EMC or a resin and can be formed using a metal pattern. In the present embodiment, the support moldings 551 and 552 can support the interfaces between the unit PCBs 500a, 500b, and 500c, which are the most vulnerable portions of the thin PCB 500. Thus, the thin PCB 500 can be inflexible during package manufacturing processes despite its very small thickness.

As explained thus far, a thin PCB for manufacturing a chip scale package (CSP) according to the present invention comprises a support molding formed along the edge of the thin PCB or a plurality of support moldings formed above and below interfaces between unit PCBs, which are vulnerable to external force. Thus, the thin PCB can be inflexible during package manufacturing processes despite its very thin thickness. Accordingly, the manufacture of semiconductor packages can be simple without using an additional supporting portion.

While the present invention has been particularly shown and described with reference to preferred embodiments thereof, it will be understood by those of ordinary skill in the art that various changes in form and details may be made therein without departing from the spirit and scope of the present invention as defined by the following claims. For example, the present invention is not limited to thin PCBs. Of course, other various thin substrates for CSPs, for example, polyimide tape substrates, can be used and include support moldings in the same manner as the thin PCBs.

Although the exemplary embodiments of the present invention have been described in detail, it should be understood that many variations and/or modifications of the basic inventive concepts herein taught, which may appear to those skilled in the art, will still fall within the spirit and scope of the present invention as defined in the appended claims.

What is claimed is:

1. An apparatus comprising:
   a thin printed circuit board for manufacturing a chip scale package, the thin printed circuit board comprising at least one unit printed circuit board, the at least one unit printed circuit board including a circuit pattern to adhere to a semiconductor chip, a substrate surrounding the circuit pattern, and at least one hole extending therethrough, the at least one hole being disposed between an edge of the thin printed circuit board and the at least one unit printed circuit board; and
   a support molding, which is spaced from the circuit pattern of each unit printed circuit board on the substrate of the at least one unit printed circuit board and formed in a ring shape along the edge of the thin printed circuit board.

2. The apparatus of claim 1, wherein the support molding is formed of one of an epoxy molding compound and a resin.

3. The apparatus of claim 1, wherein the support molding is formed using a metal pattern.

4. The apparatus of claim 1, wherein the unit printed circuit boards are arranged in a row.

5. The apparatus of claim 1, wherein the support molding is disposed between the at least one hole and the edge of the thin printed circuit board.

6. The apparatus of claim 5, wherein the at least one hole is located inside a perimeter defined by the ring shape of the support molding.

7. An apparatus comprising:
- a thin printed circuit board for manufacturing a chip scale package, the thin printed circuit board comprising at least one unit printed circuit board, the at least one unit printed circuit board including a circuit pattern to adhere to a semiconductor chip, and a substrate surrounding the circuit pattern; and
- a support molding, which is spaced from the circuit pattern of each unit printed circuit board on the substrate of the at least one unit printed circuit board and formed in a ring shape along the edge of the thin printed circuit board, wherein one or more holes or slots are vertically arranged at interfaces between adjacent unit printed circuit boards to prevent distortion of the thin printed circuit board.

* * * * *